United States Patent
Chuang et al.

(10) Patent No.: US 6,662,412 B2
(45) Date of Patent: Dec. 16, 2003

(54) BUCKLE OF IC HEAT DISSIPATING DEVICE

(76) Inventors: Tsan-Wen Chuang, 235 Chung - Ho Box 8-24, Taipei (TW); Jr. Chou, 235 Chung - Ho Box 8-24, Taipei (TW)

( * ) Notice: Subject to any disclaimer, the term of this patent is extended or adjusted under 35 U.S.C. 154(b) by 0 days.

(21) Appl. No.: 10/042,460

(22) Filed: Jan. 10, 2002

(65) Prior Publication Data

US 2003/0024081 A1 Feb. 6, 2003

(51) Int. Cl.[7] .......................... H05K 7/20; A44B 21/00
(52) U.S. Cl. .......................... 24/457; 24/458; 361/704; 174/16.3; 257/718; 165/80.3
(58) Field of Search .................. 24/457, 458; 165/80.3; 361/704; 257/718; 174/16.3

(56) References Cited

U.S. PATENT DOCUMENTS

| | | | |
|---|---|---|---|
| 5,477,916 A | * 12/1995 | Lin | 165/80.3 |
| 5,493,475 A | * 2/1996 | Lin | 361/718 |
| 5,835,347 A | * 11/1998 | Chu | 361/704 X |
| 6,332,251 B1 | * 12/2001 | Ho et al. | 24/459 |
| 6,449,154 B1 | * 9/2002 | Yoneyama et al. | 361/704 |
| 6,449,157 B1 | * 9/2002 | Chu | 361/719 X |
| 6,473,306 B2 | * 10/2002 | Koseki et al. | 361/704 |

* cited by examiner

*Primary Examiner*—Robert J. Sandy

(57) ABSTRACT

A buckle of an IC heat dissipating device for installing a heat dissipating fin device to a top surface of an IC located in an IC socket comprises a pair of clamping arms; a supporting frame being fixed to a top of the heat dissipating fin device; and an operation rod having a camshaft and a lever for rotating the camshaft. The camshaft passes through the supporting frame and is capable of rotating freely. In operation position, the cam of the camshaft will eject the pivotal connection of the clamping arms and the clamping arms will bend and deform. By the restoring force of these clamping arms, the ears at two ends of the clamping arms have sufficient forces to hook the hooks at two sides of the IC socket. In installing the present invention, the user only needs to press an operation portion slightly.

10 Claims, 8 Drawing Sheets

BUCKLE OF IC HEAT DISSIPATING DEVICE

FIELD OF THE INVENTION

The present invention relates to buckles, and particularly to a buckle of an IC heat dissipating device.

BACKGROUND OF THE INVENTION

With the advance of the central processing units (CPU) of personal computers, the heat dissipating efficiency of CPU is more and more important since overheat of a CPU will induce the reduction of heat dissipating efficiency. Moreover, the personal computer is easy to shut down. Further, the same problem may occur at other chips used as processor, such as image processing chips. To avoid this problem, some the heat dissipating technology is developed.

Referring to FIG. 1, it is illustrated that a conventional IC heat dissipating device approximately comprises a heat dissipating fan 10, a heat dissipating fin device 11, and and press buckle 12. The bottom of the heat dissipating fin device 11 is tightly adhered to the top surface of the CPU 20. Two ends of the press buckle 12 have hole-like ears 121a, 121b for hooking the hooks 31 at two sides of the IC socket 30. The heat dissipating fin device 11 is fixed to the surface of the CPU 20.

In this conventional heat dissipating device, the press buckle 12 is made of elastic metal piece. The press buckle 12 is bent and then deforms so as to generate elastic force to press the IC socket. Since in normal condition, this press buckle 12 is in a bending state, in installation, an outer force is necessary to press the buckle piece 12 to deform sufficiently. Thereby, the ears 121a, 121b of the press buckle 12 can hook the hooks 31 of the IC socket 30. Then, the press buckle 12 is released. Then the press buckle 12 will buckle the IC socket 30 by the restoring elastic force of the press buckle 12.

In assembling this conventional heat dissipating device, an outer force is necessary to press the press buckle 12 to deform. However, it is possible that the IC socket is harmed due to the carelessness of the operator. Since the outer force for installing the press buckle 12 must be larger than the force of the press buckle 12 applied to the IC socket 30 so that the two ears 121a, 121b at two ends of the press buckle 12 arrive positions sufficient to hook the hooks 31 at two sides of the IC socket 30.

SUMMARY OF THE INVENTION

Accordingly, the primary object of the present invention is to provide a buckle of an IC heat dissipating device which is safe and can be operated easily, wherein in installing the present invention, the user only needs to press an operation portion slightly, without overlarge force being applied to the central processing unit.

To achieve the object, the present invention provides a buckle of an IC heat dissipating device for installing a heat dissipating fin device to a top surface of an IC located in an IC socket; comprising: a pair of clamping arms having a first clamping arm and a second clamping arm, which are pivotally connected; the clamping arms are bent with one ends thereof being pivotally connected and another ends thereof have respective ears for hooking the hooks at two sides of the IC socket; a supporting frame being fixed to a top of the heat dissipating fin device; and an operation rod having a camshaft and a lever for rotating the camshaft. The camshaft passes through the supporting frame and is capable of rotating freely on the supporting frame. By rotating the lever, the camshaft rotates to an operational position and a releasing position. In operation position, the cam of the camshaft will eject the pivotal connection of the clamping arms and the clamping arms will bend and deform. By the restoring forces of these clamping arms, the ears at two ends of the clamping arms have sufficient forces to hook the hooks at two sides of the IC socket.

The various objects and advantages of the present invention will be more readily understood from the following detailed description when read in conjunction with the appended drawing.

DETAILED DESCRIPTION OF THE PREFERRED EMBODIMENTS

Figure 1:
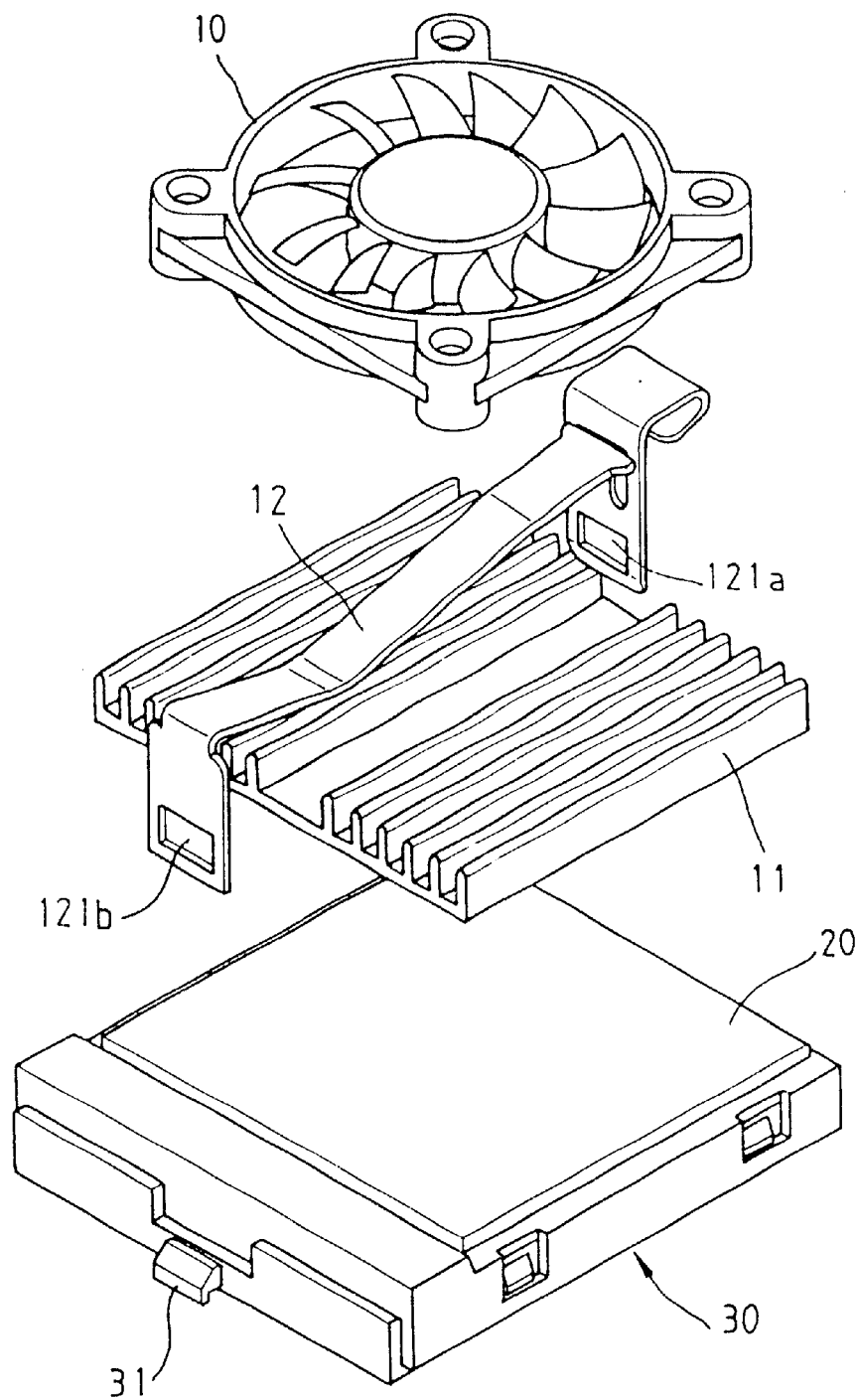
FIG. 1 shows a prior art heat dissipating device.
Figure 2:
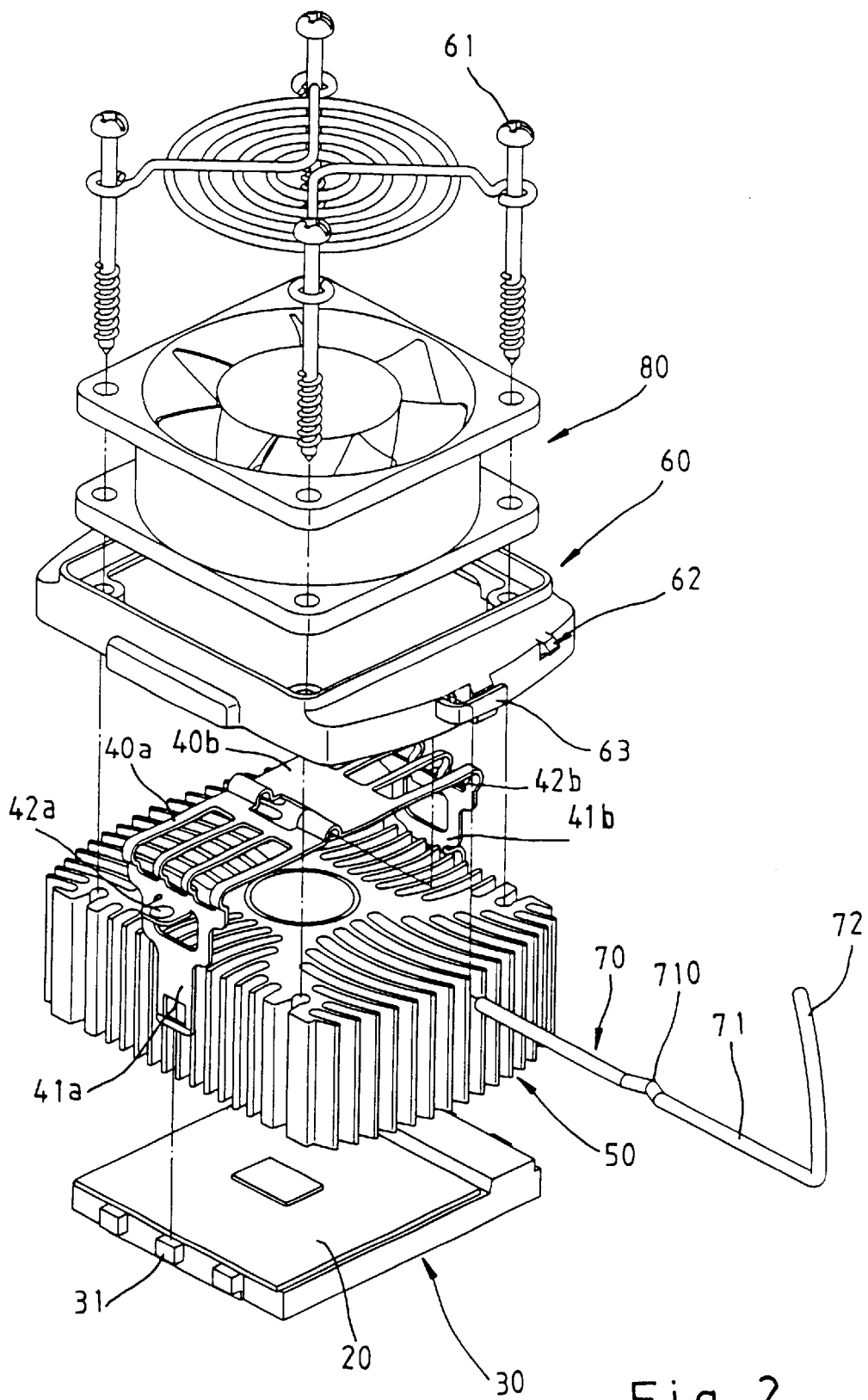
FIG. 2 is an exploded perspective view of the present invention.

Referring to FIG. 2, the buckle of the present invention is illustrated.

The buckle of the present invention has a pair of clamping arms 40a, 40b which are pivotally connected. The clamping arms 40a, 40b have the same structure and are symmetrically and made of elastic metal thin pieces (such as steel pieces). The clamping arms 40a, 40b are bent with one ends thereof being pivotally connected and another ends thereof having respective ears 41a, 41b for hooking the hooks 31 at two sides of the IC socket 30.

A heat dissipating fin device 50 is at a top of the central processing unit 20.

A supporting frame 60 is fixed to the top of the heat dissipating fin device 50.

An operation rod 70 has a camshaft 71 and a lever 72 for rotating the camshaft 71. The camshaft 71 passes through the supporting frame 60 and may rotate freely on the supporting frame. A cam 710 is located at a middle section of the camshaft 71. The cam 710 can be made by bending the camshaft 71 or changing the diameter of the cam 710. By rotating the lever 72, the camshaft 71 can be rotated to an operational position (referring to FIG. 3) and a releasing position (referring to FIG. 4). In operation position, the cam 710 of the camshaft 71 will eject the pivotal connection and the distance between the ears 41a, 41b of the clamping arms 40a, 40b and the connection is increased slightly due to bending of the clamping arms. By the restoring forces of clamping arms, the ears 41a, 41b at two ends of the clamping arms 40a, 40b have sufficient forces to hook the hooks 31 at two sides of the IC socket 30.

The pair of clamping arms 40a, 40b are made of metal elastic pieces (such as steel pieces) so as to provide sufficient restoring elastic forces after the clamping arms are bent. Thereby, the hooks 31 at two sides of the IC socket can be hooked.

In another preferred embodiment, a heat dissipating fan 80 can be extra added for providing an active heat dissipating function. The supporting frame 60 and the heat dissipating fan 80 can be screwed by a plurality of screws 61. Moreover, a plurality of heat dissipating fans 80 and the supporting frame 60 can be made integrally and then screws are used to fix the ends of the heat dissipating fans 50. Similarly, other than above mentioned method, other ways can be used to fix the fans and supporting frame, such as by riveting or by sticking.

Figure 5A:
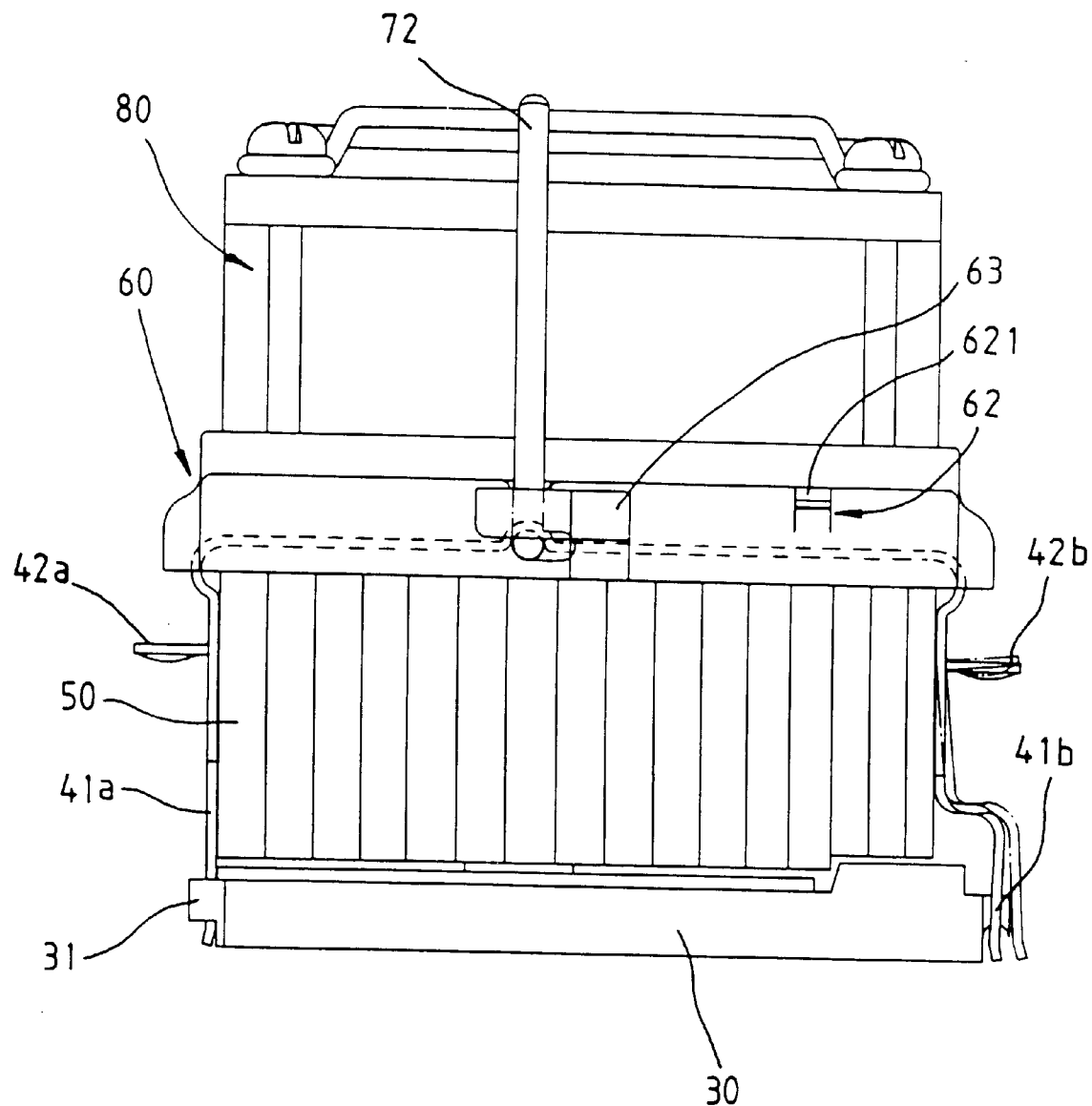
FIGS. 5A and 6A are the operational schematic view of the present invention, wherein the positions of the clamping arms are illustrated as the operation rod is in a releasing position.
Figure 5B:
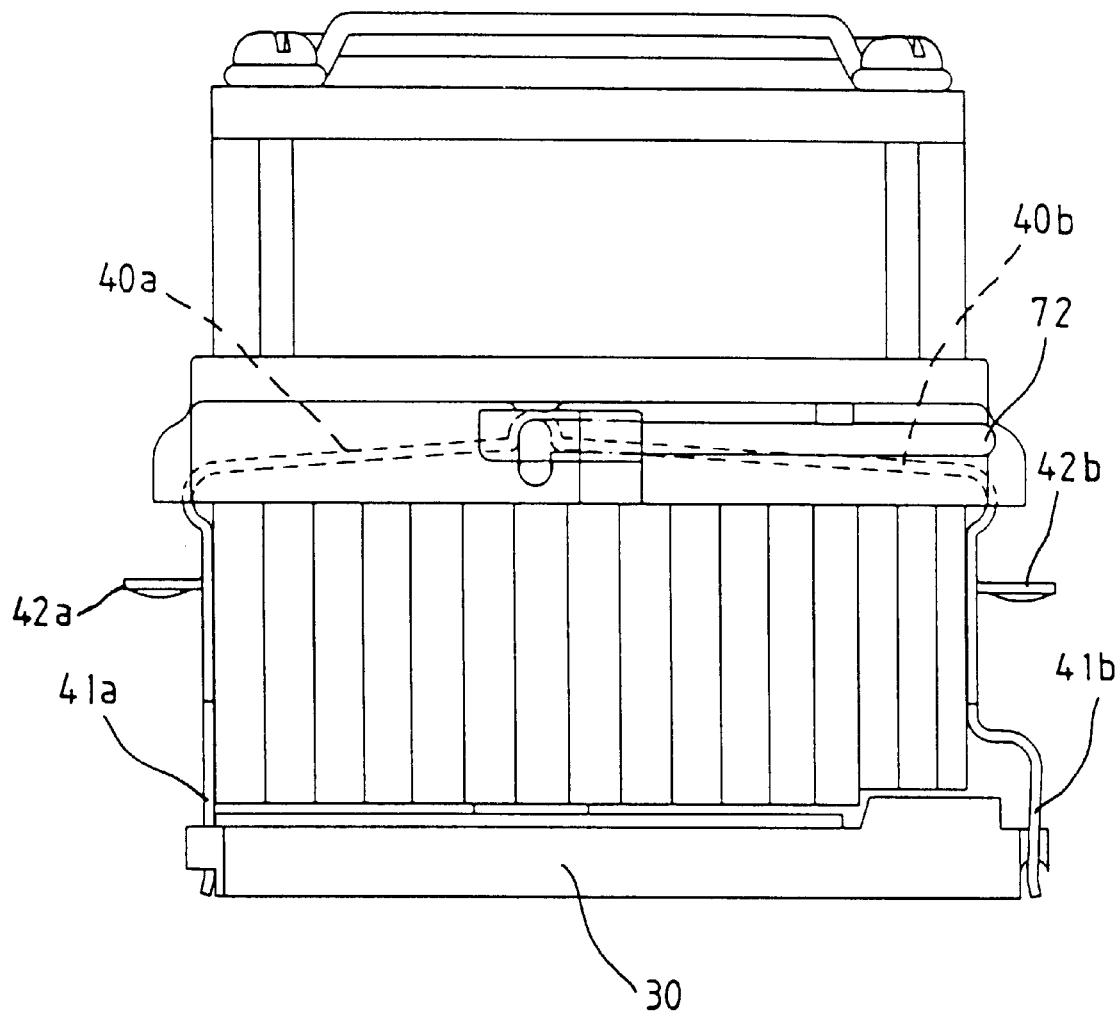
FIGS. 5B and 6B are the operational schematic view of the present invention, wherein the positions of the clamping arms are illustrated as the operation rod is in an operation position.
Figure 6A:
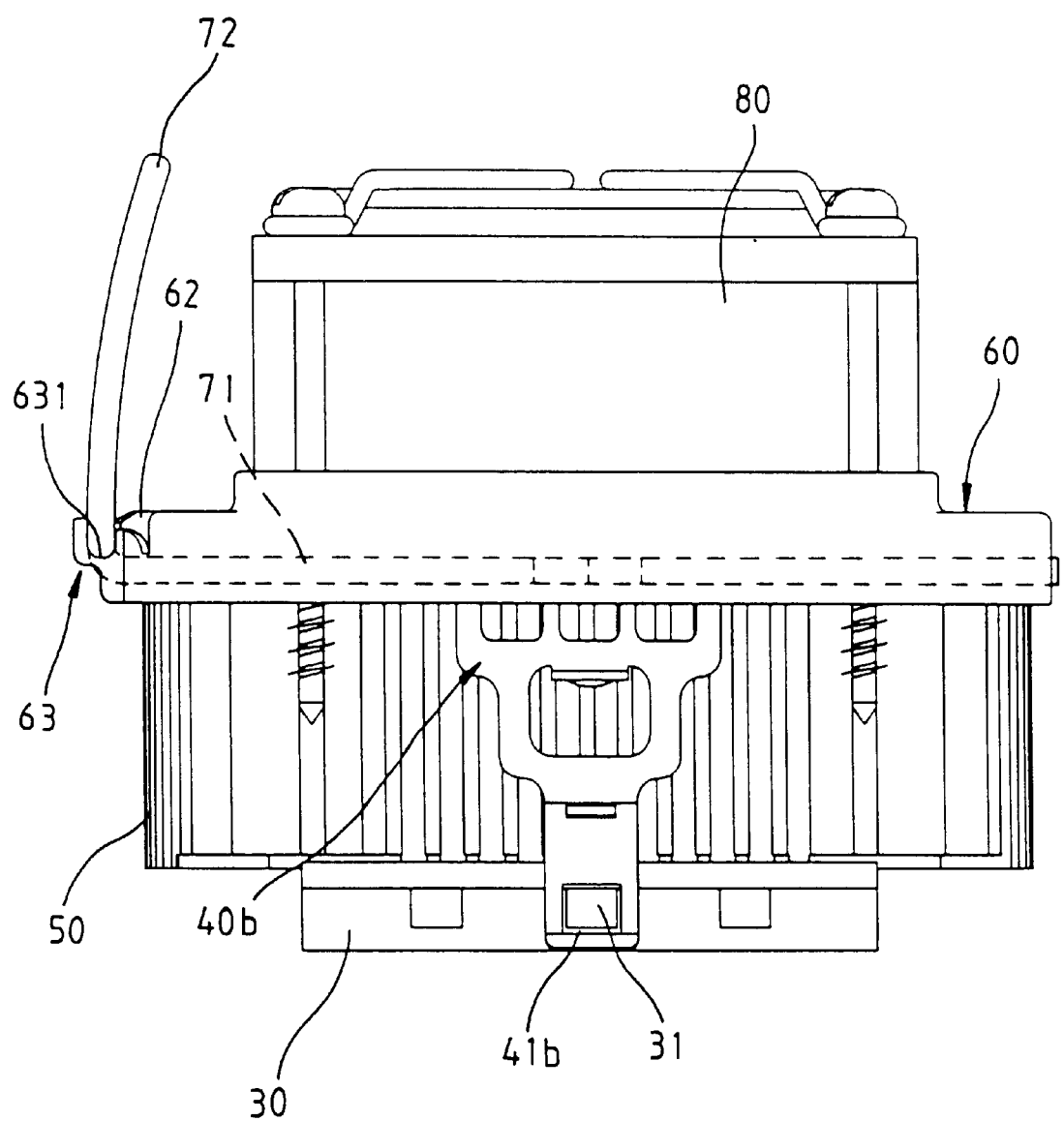
Figure 6B:
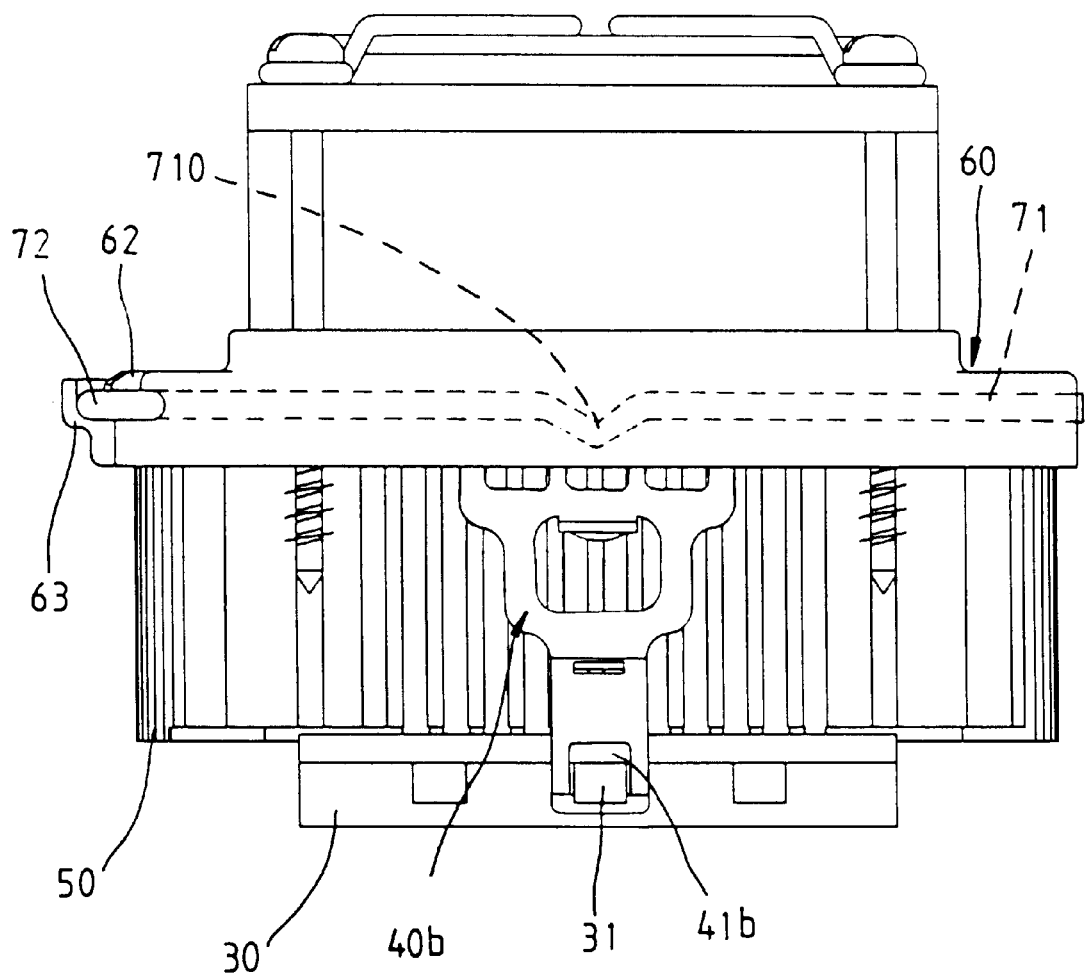

In installing the buckle of the present invention, the clamping arms 40a, 40b are expanded so that the ears 41a, 41b at two ends of the clamping arms 40a, 40b hooks the hooks 31 at two sides of the IC socket (referring to FIGS. 5A, 6A). At this time, no deformation occurs at the clamping arms 40a, 40b and no force generates. Then, the lever 72 is rotated to an operation position (referring to FIGS. 5A, 5B) so as to drive the camshaft 71 to rotate. Then, by the supporting of the top end of the heat dissipating fan device 50, the cam 710 of the camshaft 71 ejects the pivotal connection of the two clamping arms 40a, 40b so that the distance between the ears 41a, 41b of the clamping arms 40a, 40b and the pivotal connection is slightly increased and thus the clamping arms 40a, 40b is deformed. By the restoring force from the deformation, the ears 41a, 41b at two ends of the clamping arms 40a, 40b have sufficient forces to hook the hooks 31 at two sides of the IC socket 30.

At the initial time of installing this pair of clamping arms 40a, 40b, for making one ears 41a (or 41b) can be easily hooked by the hook 31 of the IC socket 30. Moreover, a slight buckling force is generated. In another preferred embodiment of the present invention, at place nearer one ear 41a (41b) of the clamping arm 40ba (40b), an outward extending operation portion 42a (42b) (referring to FIG. 5A) is formed. At this place, the ear 41b is bent so that the ear 41 is near the hook 31. Then user only needs to press the operation portion 42a (42b) slightly, and then no overlarge force is applied to the central processing unit 20. Ear 41a (41b) will move into the hook 31 so as to hook the hook 31. Finally, when the lever 72 moves to an operation position (referring to FIG. 5B), the ear 41ba (41b) will deform slightly so as to provide an elastic force to hook the hooks 31 without loosing.

Figure 3:
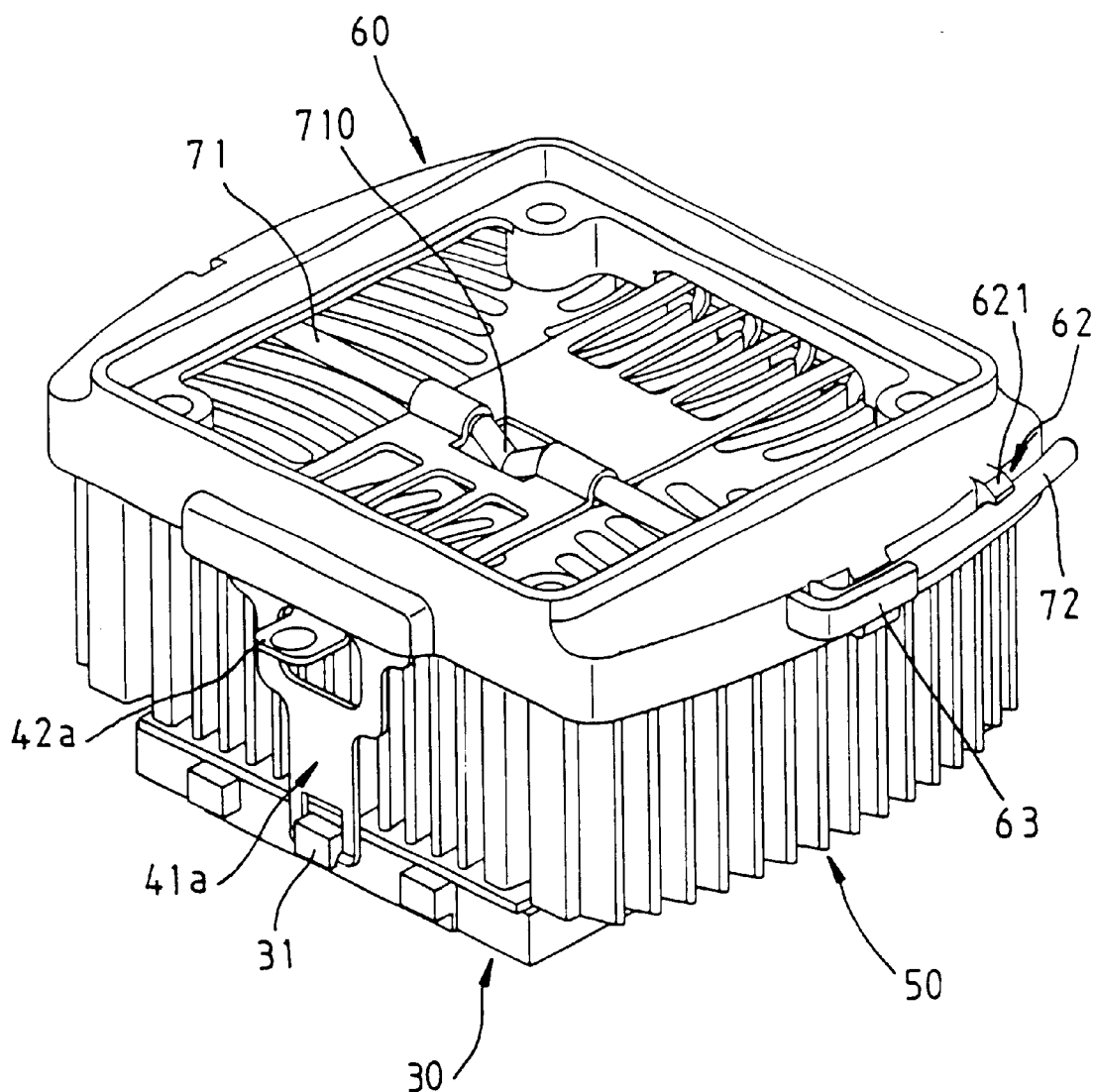
FIG. 3 is an assembled view of the present invention, wherein the operation rod is in an operation position.
Figure 4:
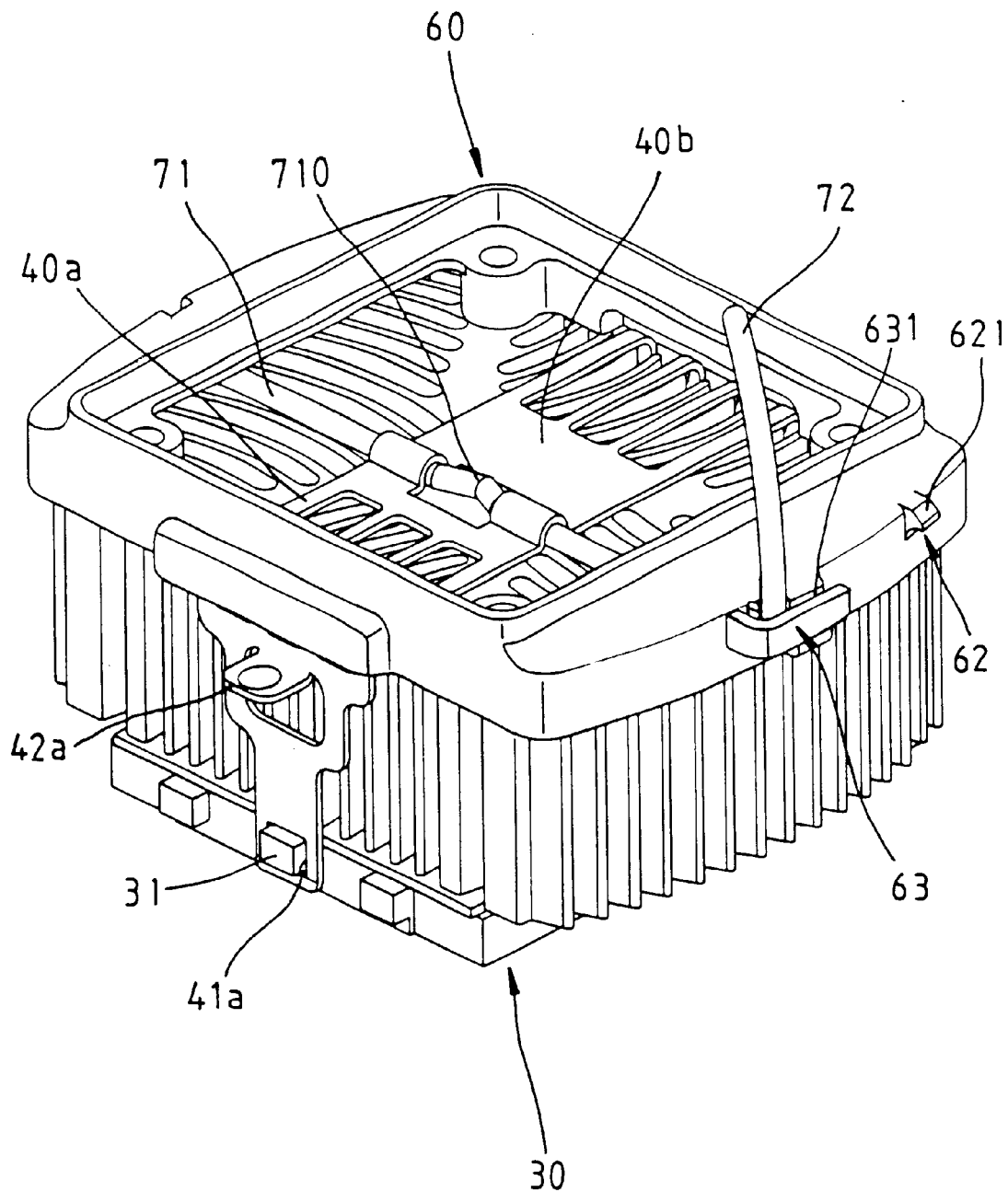
FIG. 4 shows the structure view of the present invention, wherein the operation rod is in a releasing position.

When the lever 72 of the operation portion rotates to a position as illustrated in FIG. 3, to be retained in this operation position, the periphery of the supporting frame 60 is preferably installed with a retainer for retaining it at this position. In the embodiment of the present invention, the retainer is formed by a first protrusion 62 and a second protrusion 63 which are retained with a fixed interval. The outer surface of the first protrusion 62 has a tilt surface 621. The second protrusion 63 has a groove with an opening face upwards for receiving the lever 72. By the guiding of the tilt surface 621, the lever 72 will slide into the groove 631 of the second protrusion 63 so as to be clamped between the first protrusion 62 and the second protrusion 63.

When the user is desired to take down the heat dissipating device, it is only necessary to push the lever 72 to a releasing position. Then, make the ears 41a, 41b to release from the hooks. As a result, the heat dissipating fin devices 50 and the heat dissipating fan 80 can be detached easily.

By the present invention, as installing the heat dissipating device, no force is required to be applied to the buckle since the buckle of the present invention is buckled to the IC socket without any deformation or any elastic force. After installing the buckle, by the cam to slightly engage one end of a clamping arm, the clamping arms have sufficient force for to clamp the socket of a chip.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A buckle of an IC heat dissipating device for installing a heat dissipating fin device to a top surface of an IC located in an IC socket; comprising:

a pair of clamping arms having a first clamping arm and a second clamping arm, which are pivotally connected to each other; the two clamping arms being bent with one ends thereof being pivotally connected to each other and another ends thereof having respective ears for hooking hooks at two sides of the IC socket;

a supporting frame being fixed to a top of the heat dissipating fin device; and an operation rod having a camshaft and a lever for rotating the camshaft; the camshaft passing through the supporting frame and being capable of rotating freely in the supporting frame; by rotating the lever, the camshaft rotating to an operational position and a releasing position; in the operation position, the cam of the camshaft will eject the pivotal connection of the clamping arms and the clamping arms will end and deform; by the restoring force of this clamping arms, the ears at the two ends of the clamping arms having sufficient forces to hook the hooks at two sides of the IC socket.

2. The buckle f an IC heat dissipating device as claim in claim 1, wherein each of the clamping arms have the same structure and are symmetrical and made of elastic metal thin pieces.

3. The buckle of an IC heat dissipating device as claim in claim 1, wherein the supporting frame is fixed to the heat dissipating fin device by a plurality of screws.

4. The buckle of an IC heat dissipating device as claim in claim 1, wherein the supporting frame has a retainer for fixing the lever at the operation position.

5. The buckle of an IC heat dissipating device as claim in claim 1, wherein a retainer is formed by a first protrusion and a second protrusion which are retained with a fixed interval, when the lever is rotated to the operation position, the lever is exactly clamped between the first protrusion and second protrusion.

6. The buckle of an IC heat dissipating device as claim in claim 5, wherein the first protrusion has a tilt surface and the second protrusion has a groove with an opening.

7. The buckle of an IC heat dissipating device as claim in claim 1, further comprising a heat dissipating fan; and the heat dissipating fan is fixed to the supporting frame by a plurality of screws.

8. The buckle of an IC heat dissipating device as claim in claim 1, further comprising a heat dissipating fan; and the heat dissipating fan is integrally combined with the supporting frame.

9. The buckle of an IC heat dissipating device as claim in claim 1, wherein the ear of each clamping arm has an operation portion; by pressing the operation portion, the ear will move into the hook of the IC socket.

10. The buckle of an IC heat dissipating device as claim in claim 1, wherein the cam of the camshaft is formed by bending the camshaft.

* * * * *